United States Patent [19]
Gerdes

[11] Patent Number: 5,781,447
[45] Date of Patent: Jul. 14, 1998

[54] SYSTEM FOR RECREATING A PRINTED CIRCUIT BOARD FROM DISJOINTLY FORMATTED DATA

[75] Inventor: Henry D. Gerdes, Melba, Id.

[73] Assignee: Micron Eletronics, Inc., Nampa, Id.

[21] Appl. No.: 727,707

[22] Filed: Oct. 7, 1996

Related U.S. Application Data

[63] Continuation of Ser. No. 373,512, Jan. 12, 1995, abandoned, which is a continuation of Ser. No. 106,249, Aug. 13, 1993, abandoned.

[51] Int. Cl.$^6$ ........................................ G06F 15/60
[52] U.S. Cl. .................... 364/489; 395/125; 395/500
[58] Field of Search .......................... 364/489, 488; 395/125, 500

[56] References Cited

U.S. PATENT DOCUMENTS

| | | | |
|---|---|---|---|
| 4,720,798 | 1/1988 | Reed et al. | 364/489 |
| 4,760,421 | 7/1988 | Murzyn | 354/4 |
| 4,867,566 | 9/1989 | Straayer et al. | 356/372 |
| 4,870,286 | 9/1989 | Tobuse | 250/492.2 |
| 5,005,138 | 4/1991 | Tobuse et al. | 364/519 |
| 5,051,938 | 9/1991 | Hyduke | 364/578 |
| 5,109,489 | 4/1992 | Williams | 395/125 |
| 5,157,762 | 10/1992 | Snietka | 395/129 |
| 5,172,472 | 12/1992 | Lindner et al. | 29/845 |
| 5,272,641 | 12/1993 | Ford et al. | 364/468 |
| 5,297,053 | 3/1994 | Pease et al. | 364/474.24 |
| 5,353,234 | 10/1994 | Takigami | 364/489 |
| 5,357,674 | 10/1994 | Lumbard | 29/843 |

OTHER PUBLICATIONS

*Gerber Format*, The Gerber Scientific Instrument Company, 1991 ( a subset of EIARS –274–D).

Electronic design needs special Cad, by Robinson, Phillip, MacWeek Apr. 18, 1989 v3 n16 p34(2).

*Primary Examiner*—William M. Treat
*Assistant Examiner*—Zarni Maung
*Attorney, Agent, or Firm*—Hopkins Roden Crockett Hansen & Hoopes, PLLC

[57] ABSTRACT

A system and method of recreating a Printed Circuit Board (PCB) in electronic form from disjointly formatted data. A graphical representation of the PCB is displayed as derived from electronically formatted Gerber files wherein component mounting locations are electronically selected and component identification data is merged from a non-electronically formatted bill of materials into a database for associating the component identification data with the Gerber files PCB data. This system overcomes the previously tedious, manual and error-prone process of recreating a PCB from such disjointly formatted data.

20 Claims, 8 Drawing Sheets ated by first using electrically guided photo plotter table
SYSTEM FOR RECREATING A PRINTED CIRCUIT BOARD FROM DISJOINTLY FORMATTED DATA

CROSS-REFERENCE TO RELATED APPLICATION:

This is a continuation of application Ser. No. 08/373,512, filed Jan. 12, 1995 now abandoned, which is a continuation of Ser. No. 08/106,249 filed Aug. 13, 1993, abandoned.

COPYRIGHT NOTICE

A portion of the disclosure of this patent document contains material which is subject to copyright protection. The copyright owner has no objection to the facsimile reproduction by anyone of the patent document and the patent disclosure, as it appears in the Patent and Trademark Office patent files or records, but otherwise reserves all copyright rights whatsoever.

FIELD OF THE INVENTION

The present invention relates to PCB (printed circuit boards). Particularly, there is a means for converting GERBER files into arrays that are usable in a computer environment.

BACKGROUND OF THE INVENTION

Gerber files have been in use for many years before computers were in wider use as today. Gerber files originated by first using electrically guided photo plotter table mechanisms; which were first introduced by Gerber Scientific, Inc.

FIG. 1, illustrates a basic Gerber system. Basically, the Gerber system 10 took camera exposure commands, X-axis, and Y-axis coordinates information that were previously key punched onto a paper tape 8 to run the Gerb plotter system 10. The light source 12 and station wheel 14, which contains the shapes 15 of the numbered apertures 17, as illustrated, work in unison by synchronous movement of the servo motors 16 and flash control 18 respectively. The numbering of the apertures 17, usually follow a pattern like "D01, D02, D03, D04 . . . ", each representing a different light pattern to be generated. The servo motors are obviously controlled by the punched tape reader 20, and the control circuits 22. Once a particular aperture station is selected and the exposure selected, the X and Y axis servo motors, 23 and 25 respectively, will control the positioning and subsequent movements of the system relative to the photographic film 24. Obviously, this could also be achieved by moving the film and keeping the Gerber exposure system stationary. Part of the system is the zoom lens 26 and focus control lens 28 and the associated servo motors 30 and 32 respectively. Once all of the selected apertures and X and Y movements have been completed, the film 24 would be developed and used to expose a photosensitive copper plate that would represent a circuit layer in a PCB (printed circuit board)-not shown-.

Problems

Obviously today, paper punched connotes are no longer needed with the advent of the computer. However, the same type of "dumb" information is supplied by the computerized data for todays Gerber Photoplot Files. Basically, there is the exposure info (how long to have the light on), the selected aperture (the shape of the light beam onto the photoplate), the X and Y coordinates (the position of the first spot to be illuminated), and associated movement of the film (to create the lines to connect the different IC pins and other electrical circuitry), or non-movement (to create vias, holes, etc. to other layers in the PCB).

Currently, this same type of information (Gerber) is presented to a PCB assembly company or contractor by a potential client. The client asks the contractor to give a price quote for assembling in mass quantities the designed PCB. Although the Gerber (Gerb for short) information is now provided by a computer data storage medium, like a magnetic tape, there is a lot of manual work to be done in order to figure out the exact layout of all the layers and mounting positions of the components requested to be on the final PCB product.

The company must first plot out the design and figure out the correct IC chip locations on the board. This process often takes engineers and designers several weeks of man power. The PCB designers must lay out all the layers and recreate the chip placements, figure out the testing of the PCB, and document the information on how the PCB is to be laid out and physically fabricated at each work station on the assembly line. After they have this information, then they are in a position to bid on the manufacturing costs and including identifying production process errors or trouble spots.

As one can easily foresee, there is a lot of room for error in these physical interpretations and calculations from the provided Gerb file information. Additionally, there is a considerable delay between the time the bid is first asked for and then finally provided. In todays market place, this time delay can be very costly for the customer who is trying to beat a competitor to market with a new design. Furthermore, there is little time to find where there may be potential errors in the PCB design itself.

It is noted that the above described problems, as well as other problems, are solved through the subject invention and will become more apparent, to one skilled in the art, from the detailed description of the subject invention.

SUMMARY OF THE INVENTION

One skilled in the art will appreciate the advantage of the translation of the Gerber files from the customer to a few condensed arrays of data (herein referred to as GRETA or Greta) that allows an operator or engineer to create a computer aided design of the PCB design, thus saving time and money in doing these tasks over the usual method of by hand.

Other features and advantages of the present invention may become more clear from the following detailed description of the invention, taken in conjunction with the accompanying drawings and claims, or may be learned by the practice of the invention.

Figure 1:
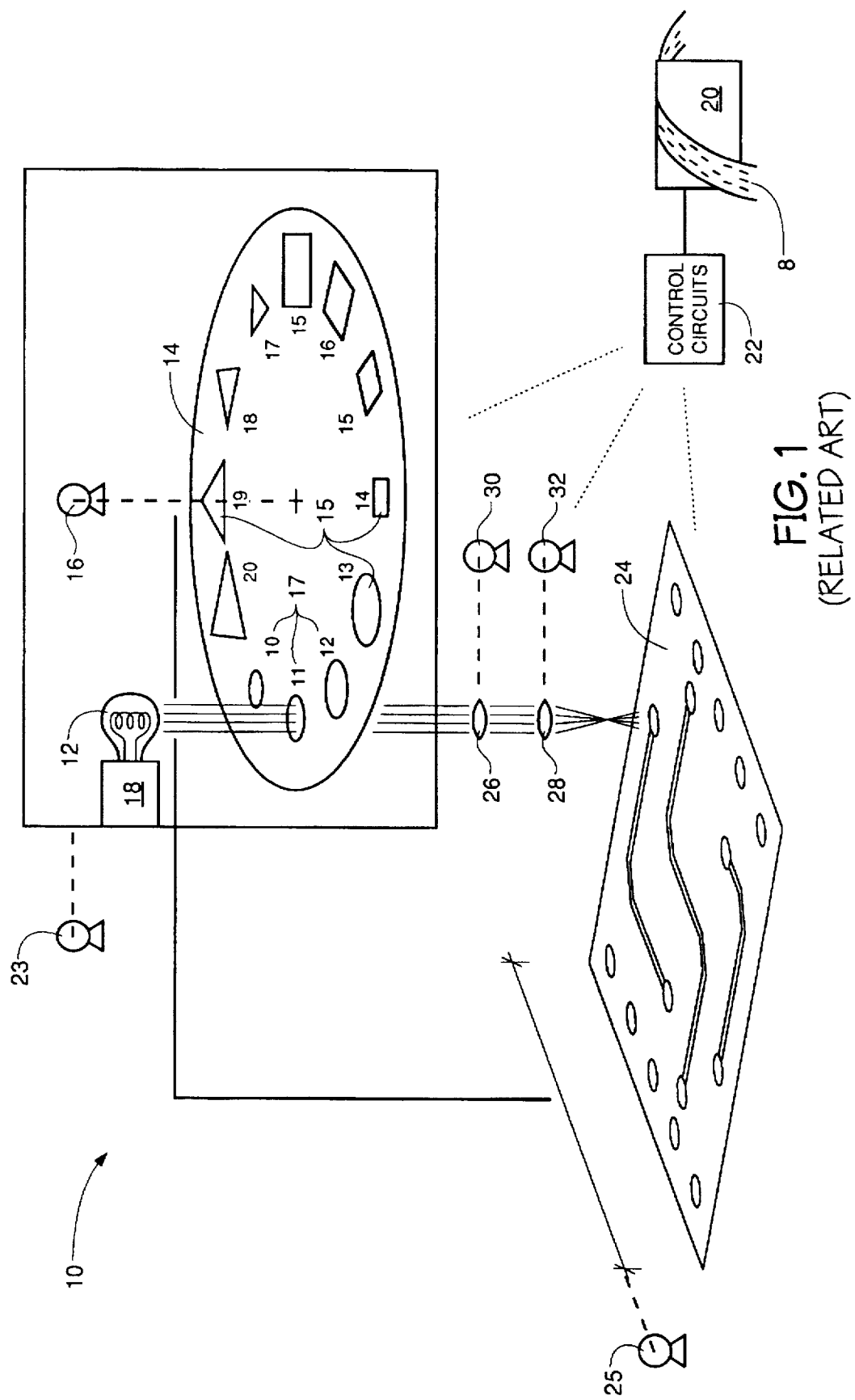
FIG. 1 is a related art illustration of an original GERBER file creation.

It is noted that the drawings of the invention are not to scale. The drawings are merely schematic representations, not intended to portray specific parameters of the invention. The drawings are intended to depict only typical embodiments of the invention, and are therefore not to be considered limiting of its scope. The invention will be described with additional specificity and detail through the use of the accompanying drawings, specification, and claims. Additionally, like numbering in the drawings represent like elements within and between drawings.

DETAILED DESCRIPTION OF THE ILLUSTRATED EMBODIMENT

This disclosure of the invention is submitted in furtherance of the constitutional purposes of the U.S. Patent Laws "to promote the progress of science and useful arts" (Article 1, Section 8 of the U.S. Constitution).

Incorporated Material

For the purpose of providing background material, which may in some respects illustrate the state of the art, the following book is herein incorporated by reference:

Title: Gerber Format; A Plot Data Format Reference Book;

published by The Gerber Scientific Instrument Company, Marketing Dept. 83 Gerber Rd. West, South Windsor, Conn 06074

General Embodiment

One skilled in the Gerber PCB (printed circuit board) photo data design, engineering, and computer software generally used, will easily understand the importance and operation of the Greta data translation invention.

Figure 2:
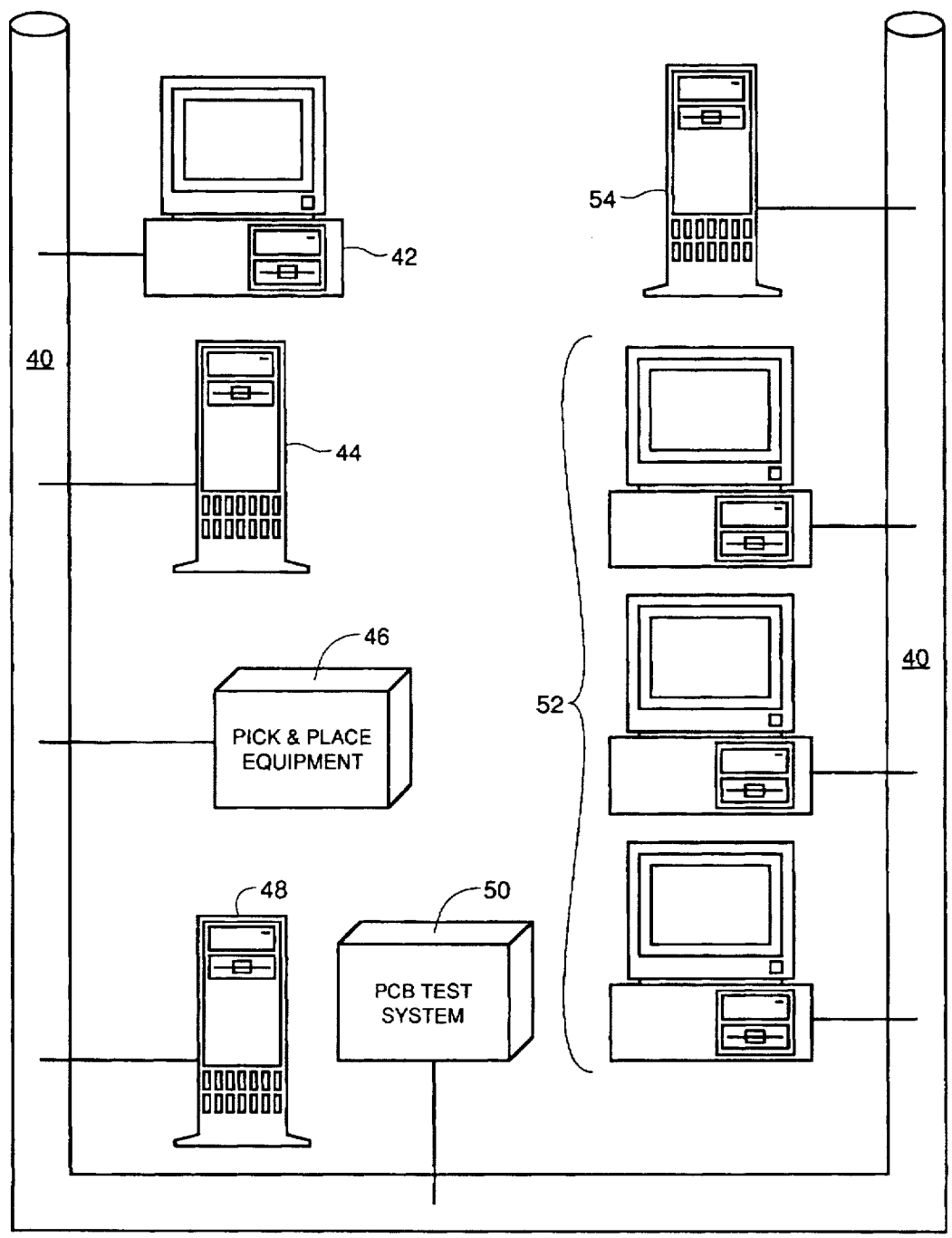
FIG. 2 is a general overall view of the Gerber reverse engineering technical assist process involving the different computer systems.

FIG. 2 illustrates a possible overall system architecture for implementing a system wide distribution of the GRETA information to the appropriate work stations as follows: There is an Ethernet system 40 to link the other systems. There is a computer station 42 provided for the operators interaction with the present interactive GRETA data generated from the GERB data. File server 44 may be used to store the Greta files (software), past customer footprint files, and Gerber information.

Once the GRETA file is created appropriate information is received by the pick an place equipment 46. These are the actual work stations on the assembly line that take the designed PCB and place the correct ICs in a correct orientation on the PCB. That is, pin 1 of each IC should be located in a specific spot on the PCB and the IC should be oriented in relation to that first pin. For example, rotating the IC 90, 180, or 270 degrees from the first pin will line up all the other pins. The main point being that GRETA and the operator have already figured out this information and is able to down load that information to the various work stations as picture diagrams for the assembly line operators.

There is a PCB test development server 48 that receives the Greta design test information, Link file (info to design a test fixture and test software for all accessible test points).

There is a PCB test system 50, that attaches to certain pins or test pads on the PCB and performs the tests stored in the PCB test system server 48. Again, the main point is that the interactive program of GRETA has already identified the test sites and the test engineers are able to designed test fixtures and software test programs based on the Greta information.

There are on line documentation terminals 52, that are used to document where and what each IC component from the BOM (bill of materials) is, and how to test the PCB. This information is for the production assembly line operators at each work station. Software is used to display pictures of the PCB for that work station. The main point being that GRETA has already completed listing the parts and where they are and identified the test pads. Thus, saving the documentation process much work.

There is a server 54 for storing the information generated by the documentation personnel. This information gives the manufacturing operators pictures and documented information directing the operators on how and where to place parts for that work station. This information is accessible by using a light scanner to read the appropriate bar code information for a particular PCB job.

FIG. 3 Discussion

Figure 3:
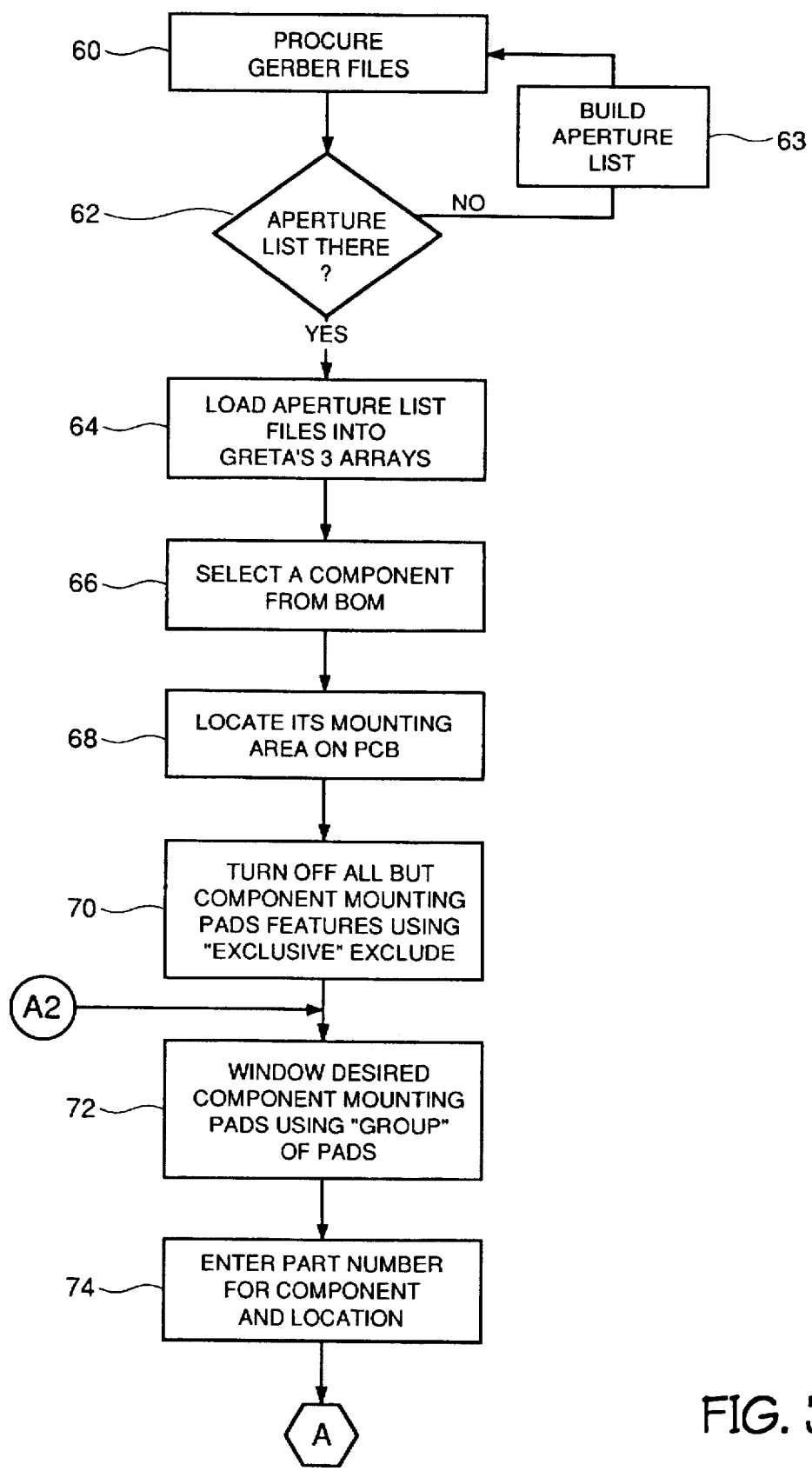
FIGS. 3, 4 and 5 is a detailed illustration of the invention involving the Greta basic overall process flow.

FIG. 3 illustrates a portion of the overall flow chart of the process involved in treating the GRETA information. Beginning with procuring the Gerber Files 60. Next, you look to see if there is an aperture list available 62. If not, then you need to build an aperture list 63. If there is provided an aperture list, then the software will begin converting the Gerber Files into Greta files at step 64. This in itself requires several steps of computer processes and interactive questioning and decision making by the computer operator. In short there is created a modified list of actual apertures used, all the X-Y locations, and moves required to recreate each PCB layer. This will be discussed in more detail in a later section.

The next step 66, being mostly interactive with the computer operator. Specifically, the operator selects one item from the Bill Of Material (BOM) from the customers list.

The next step 68, is where the Greta operator locates the mounting position of selected items and locates one position for it on the PCB top layer. It is pointed out, that each part location will have a certain pattern of holes/pads and specific sizes that aid in differentiating between other items from the BOM. Additionally, the operator does use an assembly drawing of the PCB provided by the customer. Thus, the next step 70 is to isolate certain parts from others. One way provided, is to turn off all of the other aperture information not identical to the selected PCB configuration. This is done by using an interactive window prompt called EXCLUSIVE (shut off all parts excluding the selected item). A second method, uses an EXCLUDE button that turns off all of the selected configurations. In either case, the results is that only one part type is visible to the operator on the entire PCB. This allows the following sequence of steps of identifying what part from the BOM will be placed in these selected positions.

Next, step 72, uses the command button GROUP. By selecting or highlighting a group of pads and enabling the GROUP button, you can identify all of that configuration as a component from the BOM. This is the first step in a sequence for identifying and labeling all similar components on the PCB.

This last step is an extreme time saver. All related patterns created by the GERBER file have now been selected. In step 74, the appropriate BOM item, including which company the part will be purchased from, can now be chosen to fit in that location, and in one command all of these locations are now labeled with the appropriate BOM item labeled as the particular companies exact part number. The software will also count those parts. One should remember that there could be hundreds of these locations scattered all over a very large PCB.

Figure 4:
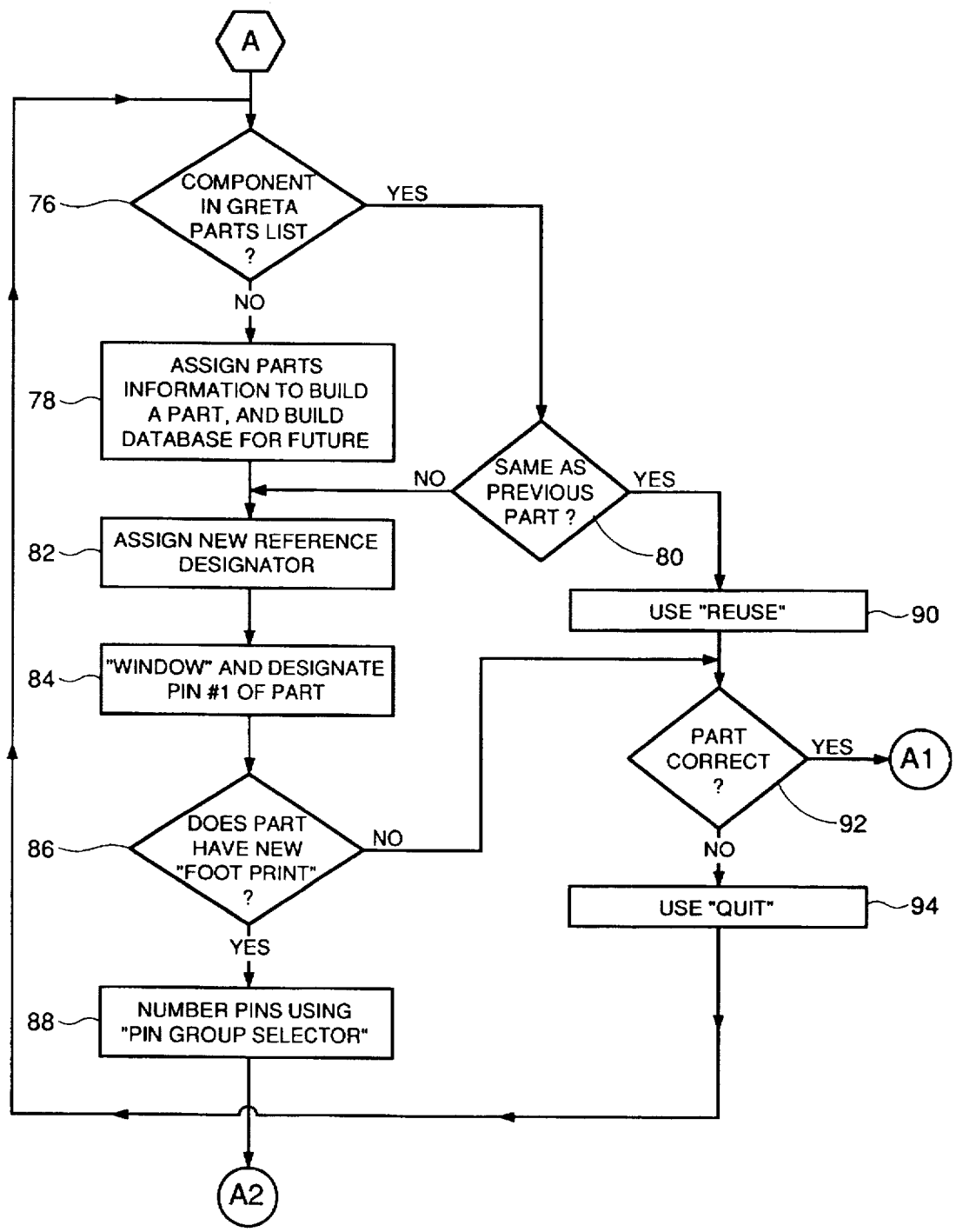

Referring to FIG. 4, in step 76, the computer program accesses past information stored on a storage medium, in this case server 44, and looks to find if the particular BOM part has already been identified and matched with a prior part. In other words, the customer may request a 16 pin PLD chip that is capable of performing a mealey-moore type of logic operation. If prior work has been done for this customer and they previously requested this part, then the software will access the stored data banks and identify what part was previously used to satisfy the customer. Also, there may have been changes in the suppliers used for this same requested part. The data base of parts will provide GRETA with the new part number and supplier.

If there were no previously stored information for the selected part number, then step 78 interacts with the computer user to assign parts information to build a part, or locate a supplier to provide the new part, and this information is now stored in the parts database.

Additionally, in step 82, the operator must assign a new reference designator number to the new part; standard ANSI codes or non-standard codes particular to that customer can be used. For example, U=chip, R=resistor, C=capacitor, W=jumper, J=jack, etc. and then a particular identifying number will be added like J124 or W046. This provides a particular code number to identify the customers BOM item.

Now that the part is identified, in step 84, the operator will designate which of the selected points of the item will, for example, be labeled pin number 1. In this way the part will now have an orientation in relation to the remaining points shown on the PCB to align to the other pins of the identified part that are placed in that location. Of course the program will similarly repeat and designate all the other grouped items with the same number 1 pin location.

In step 86, the operator is prompted, asking if the "foot print" of the part is new; for example, a sixteen pin PLD where pin 10 and 15 are not connected or removed. Additionally, this lets the operator know if its a new part which would use a socket to pop out parts, for example in using field programmable parts which are electrically configured after the PCB has been completely assembled.

If the foot print is new, in step 88, the operator must renumber all of the remaining pins, by selecting the interactive window or toggle switch "Pin Group Selector." Also, at this point, a file will be made with the new foot print information. From this point, the program will return the operator to step 72.

Going back to step 76, where the part information is found in the parts list stored from the past, step 80 will ask if the selected item is the same as the previous part that was stored in the database parts list. Sometimes the customer will have the same number, but request a different part to satisfy the spec for the PCB. If the part is different, then the program proceeds to step 82 and follows the previously described steps. If the part is the same as previously used for the customer, then in step 90, the operator selects the REUSE toggle window button.

In step 92, there is a second confirmation question. This occurs after the part is placed on the simulated PCB design, and allows the operator to visually check the layout. If there is a problem then the operator selects the QUIT button and is routed back to step 76 to create a new part number. If the part fits, and is a correct part, the operator is routed onto the next sequence of steps by selecting a CORRECT PART button.

Figure 5:
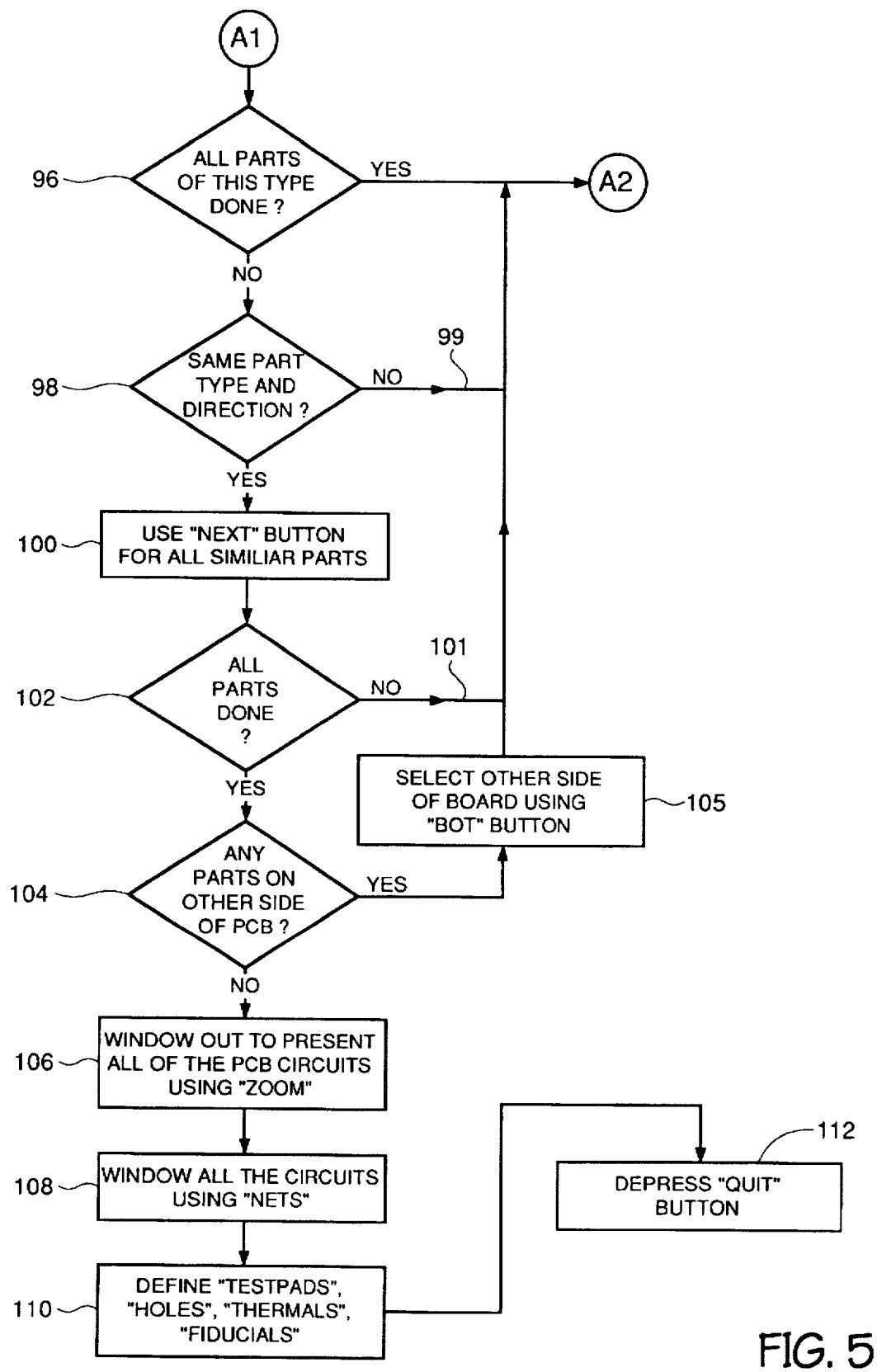

Referring to FIG. 5, in step 96, the computer prompts the operator, asking if all of the current parts selected are done. If yes, the operator is directed back to step 72, to get another Group of items to select to place more parts from the BOM of the customer. If no, then steps 98 through 105 are executed.

Step 98, inquires whether the same selected part type and direction of the part are the same. If no, 99 then this is treated as a different part in some respects, and therefore forwards the operator to step 72 again to run the operator through the same sequences of steps, i.e. 72 through 98.

If step 98, provokes a yes response, then the operator proceeds through a sequence of steps using the "Next" button. The Next button will label all the similarly configured Gerber patterns as the selected BOM item.

In step 102, the operator determines if all of the parts for the whole PCB are placed upon it. If no, then the operator is sent back to step 72 again to proceed with a new selected BOM item.

If all of the parts are placed onto the top layer of the PCB 104, the operator must determine if there are parts to be located and placed on the bottom side of the PCB. If there are parts on the opposite side, then the operator selects the "Bot" button, and is forwarded to step 72 to perform the sequence of steps as the top side of the PCB had undergone.

If there are not parts to be located on the other side of the PCB, or both sides have already been worked on, then step 106, the operator may select the "Zoom" button to view the complete PCB.

Next, the operator selects the "Nets" button to make an electrical 108 of the PCB. A Net list is a list of all the electrical connection points and the relationships therebetween. This allows a designer to proof the design and identify errors. This feature also provides the critical information to the test engineers to design the test fixtures (devices, molds) and design the software for performing the tests.

Now, in step 110, the operator is ready to define the test pads, holes, fiducials, and thermals for example. These steps are performed by selecting the appropriate buttons on the windows screen.

Once these last steps are performed the operator can select the "Quit" button to finish constructing the PCB.

SPECIFIC EMBODIMENT OF CONVERTING GERBER DATA INTO GRETA DATA

Figure 6:
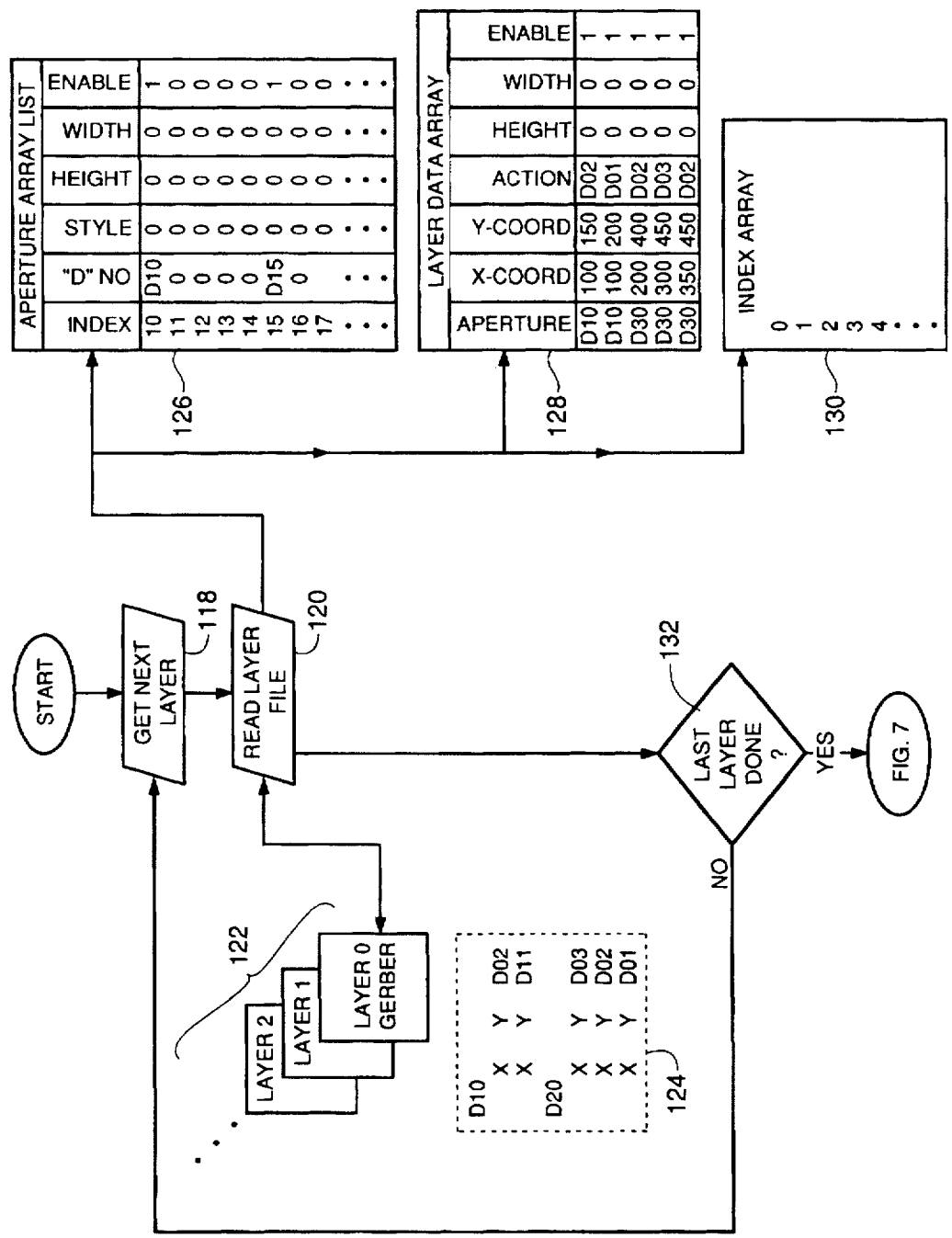
FIGS. 6, 7 and 8, illustrate the steps of 60, 62, 63, 64, and 65 from the prior figures.

In FIG. 6, there is a specific flow chart of how the GERBER "dumb" data is converted to GRETA "usable" data. The first step, 118, is to select the first layer of the Gerber file. Step 120 reads the layer file 122 in the Gerber data and converts this data into three Greta files called Aperture Array List 126, Layer Data Array 128, and Index array 130.

A typical format for a Gerber file is illustrated in box 124. For example the first number, D10, indicates the aperture to be used at the following X and Y coordinates. A command number, i.e., D01, D02, and D03, indicates flash of the light, draws a line with the light on, and a Via (hole to next layer down) respectively. This formatting is covered in the GERBER Format book incorporated into this text for illustrating what is commonly known in the art.

In step 126, an Aperture Array List is created. The first column is an index of all numbers from 10 to 1000. In operation, when a D10 is read in the Layer file in Gerber, a D10 will be entered in the second column after the 10th index number. This will likewise work for a D20 aperture, which would be entered in the 20th index location. Also, at this time, a one is entered in the enable column to indicate that the current row (D10 for example) is used by one of the layers of the PCB. Every time a D10 is used it will over write the same information at that row. Thus, at the end of reading in all of the layer information, there will be a complete list of all "D" numbers used by this particular PCB design. You will note that there are other columns that are left blank at this time. The advantage of this design will become clear later.

In step 128, all of the information from the Gerber file is entered into the Layer Data Array. However, there are other columns left blank to be filled in from another file in Gerber.

The third Greta data file is called INDEX. All that this file does is to keep a count of how many X–Y coordinates are placed onto each layer.

Step 132, is an inquiry whether you have finished the last layer of the PCB. If not, then the program takes you back to the get next layer and follow the same sequence of steps described above.

When all layers are converted to those three Greta files, the Greta program will next create a "Record of Apertures that are actually used" by the Greta data. This is important since there may be hundreds of apertures that can possibly be used, and will be listed in the Gerber aperture list, but only a certain number of them are actually used in this particular project for the customer. This following routine will identify and enable only those apertures to be used.

Figure 7:
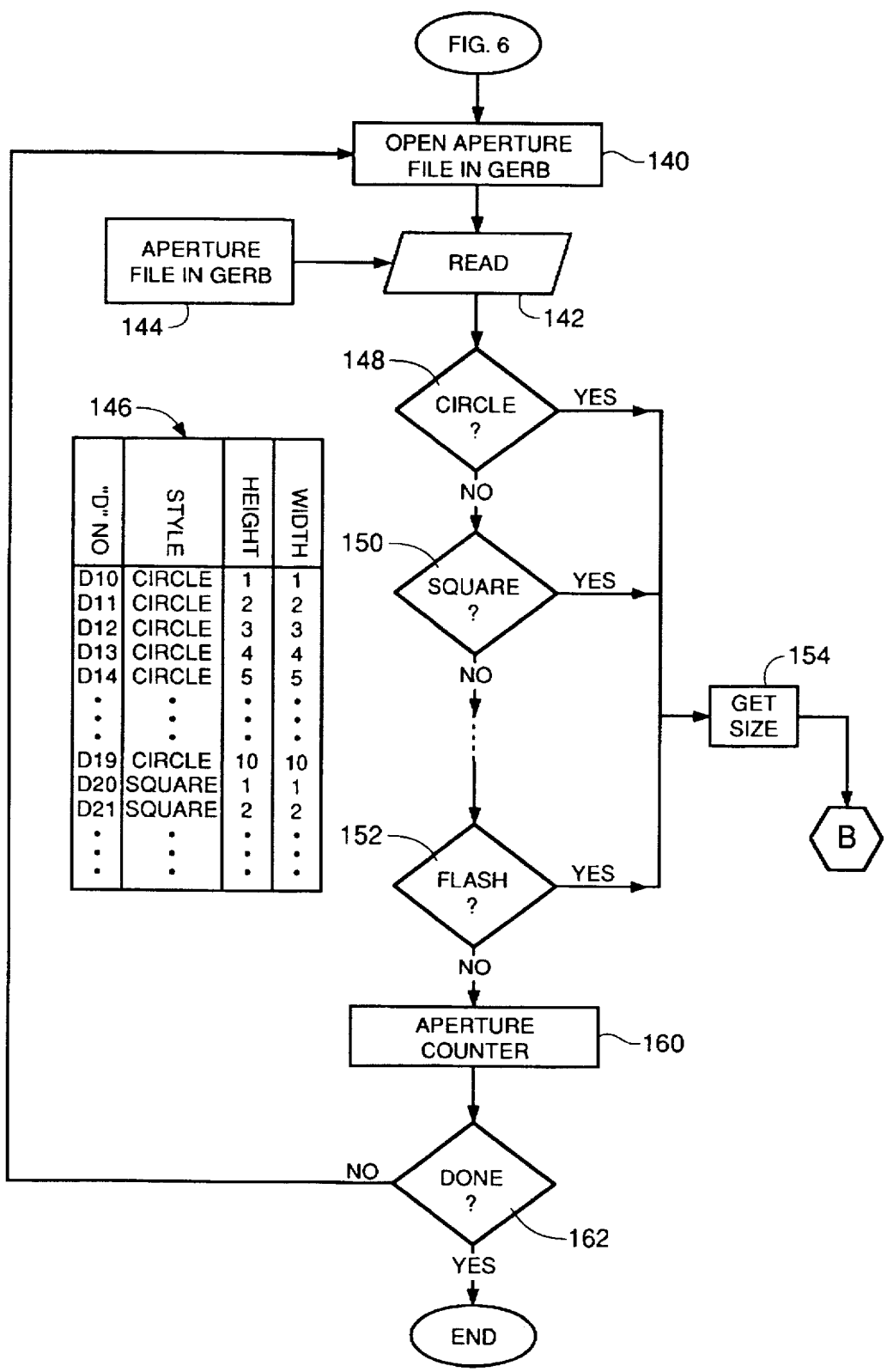

Referring to FIG. 7, step 140" opens the aperture file in Gerber 144, containing hundreds of possible apertures for use. Typically, the data can be in the form illustrated in 146.

Figure 8:
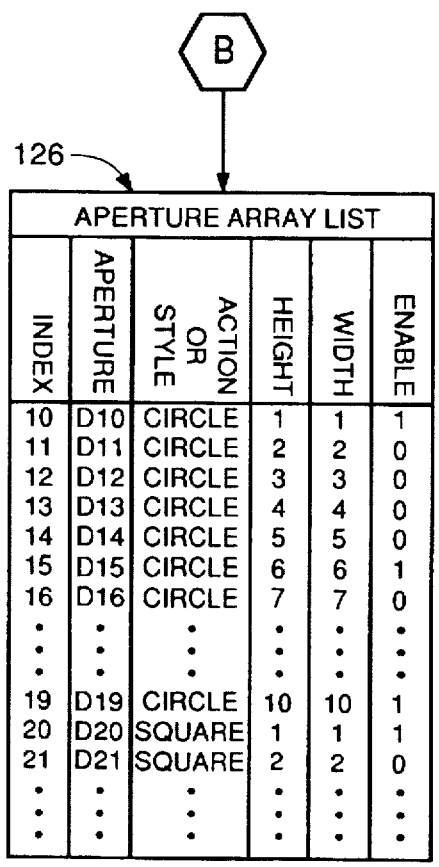

In step 142, the aperture file 144, is read one line at a time. The data is routed through a decision tree comprising elements 148 through 152. This tree illustrates a portion of the inquiries, since there are many different shapes for the apertures. However, there are generally, several sizes for each shape. Step 154 will acquire the specific size of, for example, each circle. This new data is now merged into the Aperture Array List (FIG. 8) started earlier. Now the "Height" and "Width" of each aperture is entered into the array.

One skilled in the art will notice that only the apertures that were previously enabled, in the earlier step of 126, will ever be used by the Greta program, even though all of the apertures from Gerber are entered into the updated Aperture Array List.

In step 160, there is a simple counter, to identify the number of different apertures actually used.

In step 162, once all of the aperture data in the Gerber files have been entered into Array 126, the translation of the Gerber data is complete to the Greta data.

Remarks About the Invention

A complete list of the source code to enable one skilled in the art to practice and understand the invention has been placed in the file wrapper of the application and the examiners convenience. Also, a microfiche copy of the source code for the complete invention has been placed in the file wrapper for enablement of the invention.

The Greta process allows for the reverse engineering of GERBER format files to design a database suitable for the following:

A. Generating PCB Board X/Y Data for Test Fixture design and fabrication.
B. Generating a netlist, which contains not only PCB Board trace net information, but also net information particular to device pin information.
C. Generating data to assist in generating a test program, based on information about X/Y data and netlist information.
D. Generating X/Y listings of PCB board features. 1. TEST PAD Locations. 2. Through Hole Locations. 3. Fiducial Locations. 4. Via Locations. 5. Device Pin Locations. 6. Device Placement Rotation. 7. Device Centroid Location.
E. Generating Feature Query of any section and/or whole board or enabled layers.
F. Generating X/Y Data for component placement.
G. Designing a database with enough information to be moved forward into the MITRON On Line Documentation System.

Other Remarks about the Invention

With all the data obtainable, a database which reflects a whole design can be obtained from a set of GERBER format photoplot files, and a bill of materials. This allows the bypass of manual digitizing operations to gather this data. A process which can take weeks for large complex PCB boards. The GRETA (Gerb) process can reduce this effort to a period of hours for one person, rather than days or weeks for many people. Thereby saving time and money.

Also, one of the display modes of the graphics allows spotting potential problems with designs layouts which with conventional CAD or CAM systems, are invisible. This is by use of the QUICKDRAW mode, which makes it easy to spot "drawn" features on the board which may lead to problems later.

The GRETA process is NOT a CAD program, it does not modify gerber files. It simply allows Bill of Materials information to be applied to the "dumb" GERBER format photoplot file information to build a design data base, with enough information to be "backed" into CAD System for design modification, or revision changes later on. This allows the offering of a more "complete" service by the custom PCB board manufacturer to the customer.

While there are many avenues to use in the GRETA process which allows gathering information about a PCB design, the simplest and perhaps the most useful can be described as follows:

I. OBTAINING X/Y AND NETLIST INFORMATION ABOUT ANY FEATURE ON ANY LAYER OF THE PCB BOARD.

Process . . .

1. ENABLE desired layer using the LYR button on the control panel.
2. Window (select, highlight, etc.) the desired objects using the QUERY button on the control panel.
   A. Place cursor up and to the left of the region which contains the desired objects, and depress the LEFT mouse button.
   B. Move the cursor to the lower right of the region and release the LEFT mouse button.
3. A list of all the objects in that region for the enabled layers is listed in the shell window in which the GRETA program was initiate. The information can be cut and pasted into an TEXT EDIT window and printed if desired.
4. Select the MEASURE button on the control panel.
5. Move mouse pointer to desired item.
6. Depress the RIGHT mouse button.
7. Read XY coordinates in TITLE BAR of GRAPHICS window.

II. OBTAINING MEASUREMENTS BETWEEN FEATURES ON ANY LAYER OF THE PCB BOARD.

1. ENABLE desired layer using the LYR button on the control panel.
2. Select the MEASURE button using the LEFT mouse button.
3. Move mouse pointer to initial reference point from which the measurement is to be taken.
4. Depress LEFT Mouse button.
5. Move the mouse pointer to the desired feature on the display.
6. READ the X and Y measurements on the TITLE LINE of the graphics window.

III. MERGING BILL OF MATERIALS INFORMATION WITH GERBER INFORMATION TO DEVELOP AN INTELLIGENT DESIGN DATABASE.

1. ENABLE the first layer of the board (TOP), using the TOP button on the control panel.
2. DISABLE all the vias, and unwanted items from the display using the EXCLUDE button, and the EXCLUSIVE button on the control panel.
   A. Window objects that are undesirable, EXCLUDE, (i.e. Objects that represent connection pads of components), or OBJECTS which are desired (i.e. objects that represent connection pads) with the LEFT mouse button. Repeat this process until the only items that are displayed, are connector pads for the various components.
3. Using the assembly drawing, identify the pad group for a component on the BILL of MATERIALS.
   A. Select the GROUP button on the control panel.
   B. Window the component PAD group that represents the component, using the LEFT button.
   C. Enter the part number of item in the POP-UP window.
      1. If the part is known in the part database, all it's information will be retrieved and assigned to the group of pads which were just selected by the GROUP button.
      2. If the part is not previously known, a NEW PART POP-UP window will appear, and the information about the port will be recorded, and assigned to the pad grouping.
   D. Window PIN 1 of the part, using the LEFT mouse button. This establishes a reference point to rotate the template part foot print around.
   E. Assign the reference designator by:
      1. Choosing an entry from the scrolling list of ANSI reference designators.
         a. Allowing the choice of an automatically incremented reference designator number, or entering one manually.
      2. Entering a custom reference designator and number, in the case where they are not standard.
   F. In the case where the part was already in the parts database, the pins and the physical entry are already known.
      1. Accept the part by selecting the ACCEPT icon button with the LEFT mouse button.
   G. In the case where the part was not resident in the parts database.
      1. Window the part pins in groups, (in numerical order), by use of the PIN GROUP SELECTOR icon button selected with the LEFT mouse button.
      2. Accept the part by selecting the ACCEPT icon button, with the LEFT mouse button.
   H. When the part is accepted, rotation is calculated by PIN 1 positioning in relation to all the other pins.
      1. Manual rotation forcing is available by selecting the ROTATE button and entering a rotation value.
      2. Manual rotation can be affected by selecting the ROTATION SPIN buttons on the PADS panel and visually matching the PHYSICAL ENTRY to that displayed in the GERBER graphical display.
         a. Selecting the ROTATE button and rotating the PHYSICAL ENTRY being displayed in the PADS graphical panel until it matches the foot print being displayed in the GERBER graphical display.

IV. ASSIGN FIDUCIAL AND TOOLING HOLE INFORMATION.

1. To assign fiducial information:
   A. Select the FIDUCIAL icon button with the LEFT mouse button. 1. Repeat for successive features. 2. To assign TOOLING HOLE information:
   B. Select the HOLE icon button with the LEFT mouse button. 1. Repeat for successive features.

V. GENERATE TESTLINK, PICK AND PLACE, AND DOCUMENTATION INFORMATION FILES.

1. Select the QUIT button.
   A. TESTLINK FILE: (gives all XY nodes for test probes to go, what device is on the test node, what test to perform at that test node) <DESIGNNAME>, link is generated and written to disk in the current working directory.
   B. PICK AND PLACE INFORMATION FILE:
   <DESIGNNAME>, file is generated and written to disk in the current working directory.
      1. This file contains all the information needed to place the part. a. Pin 1 XY information. b. Part Centroid (Center of Part) XY information.
   C. Part Rotation information. C. DOCUMENTATION INFORMATION FILE: <DESIGNNAME>, file is generated and written to disc in the current working directory.
      1. This file contains all the information needed to build the interface files to several on line documentation packages; all components, centroid, pin 1, rotation, minimum XY maximum XY area of part.

The output files are TEXT type file, to allow editing the output information. In the case where some data needs to be forced to a particular value, or part type information such as part number needs to be changed to reflect another product type.

Variations of the Invention

While the invention has been taught with specific reference to these embodiments, someone skilled in the art will recognize that changes can be made in form and detail without departing from the spirit and the scope of the invention. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

Although subheadings in the Detailed Description of the Illustrated Embodiment are used, these are merely provided for assisting the reader; wherein, the writer is free to enter any information under any heading/s.

What is claimed and desired to be secured by United States Patent is:

1. A method of recreating a populated Printed Circuit Board (PCB) in electronic form from disjointly formatted data, comprising the steps of:
   a) accessing from a computer data storage medium a stored Gerber file and aperture list having data descriptive of a circuit layer without component information for partially recreating said PCB;
   b) displaying on a computer display screen a graphical representation of said circuit layer of said PCB by interpreting said descriptive data stored in said accessed Gerber file and aperture list;
   c) selecting a mounting location on said graphically displayed PCB for an identified component, wherein said component is identified from disjointly formatted data relative to said data descriptive of a circuit layer;

d) storing component identification data to said storage medium for said identified component and selected mounting location, said identification data obtained from said disjointly formatted data; and, e) associating said component identification data, Gerber file and aperture list data together in a database on said storage medium for accessing purposes.

2. The method of recreating a PCB according to claim 1 wherein said disjointly formatted data comprises electronic and non electronic data.

3. The method of recreating a PCB according to claim 2 wherein said identified component is identified from said non electronic data.

4. The method of recreating a PCB according to claim 3 wherein said non electronic data is a bill of materials.

5. The method of recreating a PCB according to claim 1 including repeating steps c) and d) for each component associated with said PCB.

6. The method of recreating a PCB according to claim 1 wherein the step of displaying a graphical representation of said PCB includes displaying a selected portion of said PCB.

7. The method of recreating a PCB according to claim 6 wherein said selected portion includes said mounting location for said component identified by mounting pads displayed' on said PCB.

8. The method of recreating a PCB according to claim 1 wherein the step of selecting a mounting location includes selecting a plurality of mounting locations for said identified component.

9. The method of recreating a PCB according to claim 8 further including storing said component identification data for said plurality of selected mounting locations.

10. The method of recreating a PCB according to claim 1 wherein said component identification data includes a part number, location reference number, and manufacturer specification data.

11. The method of recreating a PCB according to claim 1 further including accessing said associated data for use in manufacturing, testing, and documenting of said PCB.

12. A system for recreating a populated Printed Circuit Board (PCB) in electronic form from disjointly formatted data, comprising:

a) means for accessing from a computer data storage medium a stored Gerber file and aperture list having data descriptive of a circuit layer without component information for partially recreating said PCB;

b) means for displaying on a computer display screen a graphical representation of said circuit layer of said PCB by interpreting said descriptive data stored in said accessed Gerber file and aperture list;

c) means for selecting a mounting location on said graphically displayed PCB for an identified component, wherein said component is identified from disjointly formatted data relative to said data descriptive of a circuit layer;

d) means for storing component identification data to said storage medium for said identified component and selected mounting location, said identification data obtained from said disjointly formatted data; and, e) means for associating said component identification data, Gerber file and aperture list data together in a database on said storage medium for accessing purposes.

13. The system for recreating a PCB according to claim 12 wherein said disjointly formatted data comprises electronic and non electronic data.

14. The system for recreating a PCB according to claim 13 wherein said identified component is identified from said non electronic data.

15. The system for recreating a PCB according to claim 14 wherein said non electronic data is a bill of materials.

16. The system for recreating a PCB according to claim 12 further including means for displaying a selected portion of said PCB.

17. The system for recreating a PCB according to claim 16 wherein said selected portion includes said mounting location for said component identified by mounting pads displayed on said PCB.

18. The system for recreating a PCB according to claim 12 further including means for selecting a plurality of mounting locations for said identified component.

19. The system for recreating a PCB according to claim 18 further including means for storing said component identification data for said plurality of selected mounting locations.

20. The system for recreating a PCB according to claim 12 further including means for accessing said associated data.

* * * * *